United States Patent
Aoyama

(10) Patent No.: US 10,163,390 B2
(45) Date of Patent: *Dec. 25, 2018

(54) DISPLAY CONTROL APPARATUS AND METHOD

(71) Applicant: SONY CORPORATION, Tokyo (JP)

(72) Inventor: Koji Aoyama, Saitama (JP)

(73) Assignee: SONY CORPORATION, Tokyo (JP)

( * ) Notice: Subject to any disclaimer, the term of this patent is extended or adjusted under 35 U.S.C. 154(b) by 80 days.

This patent is subject to a terminal disclaimer.

(21) Appl. No.: 15/496,640

(22) Filed: Apr. 25, 2017

(65) Prior Publication Data

US 2017/0229064 A1 Aug. 10, 2017

Related U.S. Application Data

(63) Continuation of application No. 14/763,005, filed as application No. PCT/JP2014/050900 on Jan. 20, 2014, now Pat. No. 9,666,121.

(30) Foreign Application Priority Data

Jan. 30, 2013 (JP) ................. 2013-015522

(51) Int. Cl.
| | |
|---|---|
| G09G 5/00 | (2006.01) |
| G09G 3/3208 | (2016.01) |
| G09G 3/20 | (2006.01) |
| H01L 27/32 | (2006.01) |
| G09G 5/10 | (2006.01) |
| H01L 51/50 | (2006.01) |

(52) U.S. Cl.
CPC ............. *G09G 3/3208* (2013.01); *G09G 3/20* (2013.01); *G09G 5/10* (2013.01); *H01L 27/322* (2013.01);

(Continued)

(58) Field of Classification Search
CPC .. G09G 3/3208; G09G 5/10; G09G 2360/144; G09G 2320/046;

(Continued)

(56) References Cited

U.S. PATENT DOCUMENTS

| | | | |
|---|---|---|---|
| 2002/0097194 A1 | 7/2002 | Uchida et al. | |
| 2006/0072047 A1 | 4/2006 | Sekiguchi | |
| 2006/0132424 A1* | 6/2006 | Foo | G02F 1/13318 345/102 |
| 2009/0256830 A1* | 10/2009 | Klinghult | G09G 3/3208 345/211 |

(Continued)

FOREIGN PATENT DOCUMENTS

| | | |
|---|---|---|
| CN | 1366290 A | 8/2002 |
| JP | 2001-092390 | 4/2001 |
| JP | 2002-328630 | 11/2002 |
| JP | 2003-131619 | 5/2003 |
| JP | 2008-197634 | 8/2008 |

(Continued)

OTHER PUBLICATIONS

Feb. 22, 2017, CN communication issued for related CN application No. 201480005903.7.

*Primary Examiner* — Claire X Pappas
*Assistant Examiner* — Gerald Oliver
(74) *Attorney, Agent, or Firm* — Paratus Law Group, PLLC

(57) ABSTRACT

Provided is a display control apparatus including: a display control unit configured to distribute brightness information to a plurality of display devices in accordance with external light amount information from a sensor; and a plurality of drive units configured to drive the plurality of display devices on a basis of the brightness information distributed by the display control unit.

12 Claims, 15 Drawing Sheets

(52) U.S. Cl.
CPC ...... *H01L 27/3211* (2013.01); *H01L 27/3225* (2013.01); *H01L 51/5012* (2013.01); *G09G 2300/023* (2013.01); *G09G 2320/046* (2013.01); *G09G 2320/0613* (2013.01); *G09G 2330/00* (2013.01); *G09G 2330/021* (2013.01); *G09G 2360/08* (2013.01); *G09G 2360/144* (2013.01); *H01L 51/50* (2013.01)

(58) Field of Classification Search
CPC .......... G09G 2300/023; H01L 27/3223; H01L 27/3211; H01L 27/3225; H01L 51/5012
See application file for complete search history.

(56) References Cited

U.S. PATENT DOCUMENTS

| | | |
|---|---|---|
| 2011/0050545 A1 | 3/2011 | Namm et al. |
| 2011/0124376 A1 | 5/2011 | Kim et al. |
| 2011/0292095 A1 | 12/2011 | Yoshida et al. |
| 2013/0141310 A1* | 6/2013 | Joo .......................... G09G 5/00 345/4 |
| 2013/0241804 A1* | 9/2013 | Yang .................... G06F 3/1423 345/3.1 |

FOREIGN PATENT DOCUMENTS

| | | |
|---|---|---|
| JP | 2009-098537 | 5/2009 |
| JP | 2010-537226 | 12/2010 |
| JP | 2011-203730 | 10/2011 |
| JP | 2012-528352 | 11/2012 |

* cited by examiner

FIG. 2

|  | E-Paper (DISPLAY DEVICE 42) | OLED (DISPLAY DEVICE 41) |
|---|---|---|
| BRIGHTNESS AND GRADATION | FAIR | VERY GOOD |
| COLOR DEVELOPMENT | POOR | VERY GOOD |
| RESPONSE SPEED | POOR | VERY GOOD |
| POWER CONSUMPTION | VERY GOOD | POOR |
| VISIBILITY UNDER EXTERNAL LIGHT | VERY GOOD | GOOD |
| BURN-IN | VERY GOOD | POOR | l = e+d
s: INCIDENT LIGHT (AMBIENT LIGHT)
e: REFLECTED LIGHT (REFLECTED LIGHT)
d: OLED EMISSION
l: DISPLAY LIGHT (DISPLAY LIGHT)

FIG. 8

| REMAINING BATTERY POWER | IMAGE FEATURE | m = 0 (NO MOTION) | m = 1 (THERE IS MOTION) |
|---|---|---|---|
| B = 0.5 (SOME REMAINING) | a = 0 (NATURAL IMAGE) | w = 0.5 (NORMAL) | w = 0 (PRIORITY ON OLED) |
| B = 0.5 (SOME REMAINING) | a = 1 (TEXT) | w = 1.0 (PRIORITY ON ePaper) | w = 0 (PRIORITY ON OLED) |
| B = 1.0 (NONE REMAINING) | a = 0 (NATURAL IMAGE) | w = 1.0 (PRIORITY ON ePaper) | w = 0 (PRIORITY ON OLED) |
| B = 1.0 (NONE REMAINING) | a = 1 (TEXT) | w = 1.0 (PRIORITY ON ePaper) | w = 0 (PRIORITY ON OLED) |

DISPLAY CONTROL APPARATUS AND METHOD

CROSS-REFERENCE TO PRIOR APPLICATION

This application is a continuation of U.S. patent application Ser. No. 14/763,005 (filed on Jul. 23, 2015), which is a National Stage Patent Application of PCT International Patent Application No. PCT/JP2014/050900 (filed on Jan. 20, 2014) under 35 U.S.C. § 371, which claims priority to Japanese Patent Application No. 2013-015522 (filed on Jan. 30, 2013), which are all hereby incorporated by reference in their entirety.

TECHNICAL FIELD

The present disclosure relates to a display control apparatus and a method and, in particular, relates to a display control apparatus and a method that enable a plurality of display devices to be seamlessly switched.

BACKGROUND ART

Display (display) devices in various modes depending on materials and characteristics, such as liquid crystal devices (LCD), organic light-emitting diodes (OLED: organic electroluminescence (EL)), are used in televisions and in mobile phones. Furthermore, in recent years, electronic paper (ePaper) devices for electronic books adopting a microcapsule system, an electrophoresis system, or the like have been used. Furthermore, by using a material with high transparency, a transparent OLED and a transparent electronic paper are being developed.

Since electronic paper performs display through reflected light and OLED performs display through spontaneous light emission, the property difference between the devices themselves appears as their characteristic differences. Generally, while OLED shows high performance in brightness, gradation, color development, and response speed, electronic paper is superior in power consumption and visibility under external light. Furthermore, OLED has a risk of aging due to burn-in.

With such a background, Patent Literature 1 describes a proposal in which a transparent OLED on the front side and an electronic paper on the backside serve as display layers.

CITATION LIST

Patent Literature

Patent Literature 1: JP 2008-197634A

SUMMARY OF INVENTION

Technical Problem

However, as the proposal describes "a device and a method that bring about the display output and color of a high frame rate during operation, and that insure that display information can be held, even if electric power is removed", either of the display devices are selected according to the state of the electric power such that during operation, transparent OLED is selected, and when the electric power is off, electronic paper is selected.

Accordingly, switching between the display devices is not seamless.

The present disclosure has been made in view of the above situation and enables a plurality of display devices to be seamlessly switched.

Solution to Problem

According to an aspect of the present disclosure, there is provided a display control apparatus including: a display control unit configured to distribute brightness information to a plurality of display devices in accordance with external light amount information from a sensor; and a plurality of drive units configured to drive the plurality of display devices on a basis of the brightness information distributed by the display control unit.

The sensor configured to acquire the external light amount information can be further included.

Among the plurality of display devices, a display device stacked on an upper surface may be a transmission display device and a display device stacked on a lower surface may be a reflective display device.

The display device stacked on the upper surface may be a self-luminous display device and the display device stacked on the lower surface may be a display device that retains a pixel state.

The display device stacked on the upper surface may be an organic light-emitting diode (OLED) and the display device stacked on the lower surface may be an electronic paper display device.

A weight computation unit configured to compute a display weight, on a basis of whether an area is a text or a graphic area, as image feature information of an input image can be further included. The display control unit can distribute the brightness information to the plurality of display devices in accordance with the display weight computed by the weight computation unit.

A weight computation unit configured to compute a display weight on a basis of motion information of an input image can be further included. The display control unit can distribute the brightness information to the plurality of display devices in accordance with the display weight computed by the weight computation unit.

A weight computation unit configured to compute a display weight on a basis of remaining battery power information can be further included. The display control unit can distribute the brightness information to the plurality of display devices in accordance with the display weight computed by the weight computation unit.

According to an aspect of the present disclosure, there is provided a display control method including: distributing, by a display control apparatus, brightness information to a plurality of display devices in accordance with external light amount information from a sensor; and driving, by the display control apparatus, each of the plurality of display devices on a basis of the distributed brightness information.

In an aspect of the present disclosure, brightness information is distributed to a plurality of display devices in accordance with external light amount information from a sensor, and each of the plurality of display devices is driven on the basis of the distributed brightness information.

Advantageous Effects of Invention

According to an aspect of the present disclosure, display of an image can be controlled. Particularly, switching between a plurality of display devices can be performed seamlessly.

BRIEF DESCRIPTION OF DRAWINGS

FIG. 2 is a diagram illustrating a general characteristic comparison between an E-Paper and an OLED.

FIG. 8 is a diagram illustrating a computation table of display weight information w.

DESCRIPTION OF EMBODIMENTS

Hereinafter, a configuration (hereinafter, referred to as an embodiment) for implementing the present disclosure will be described.

[Configuration Example of Display Control System]

Figure 1:
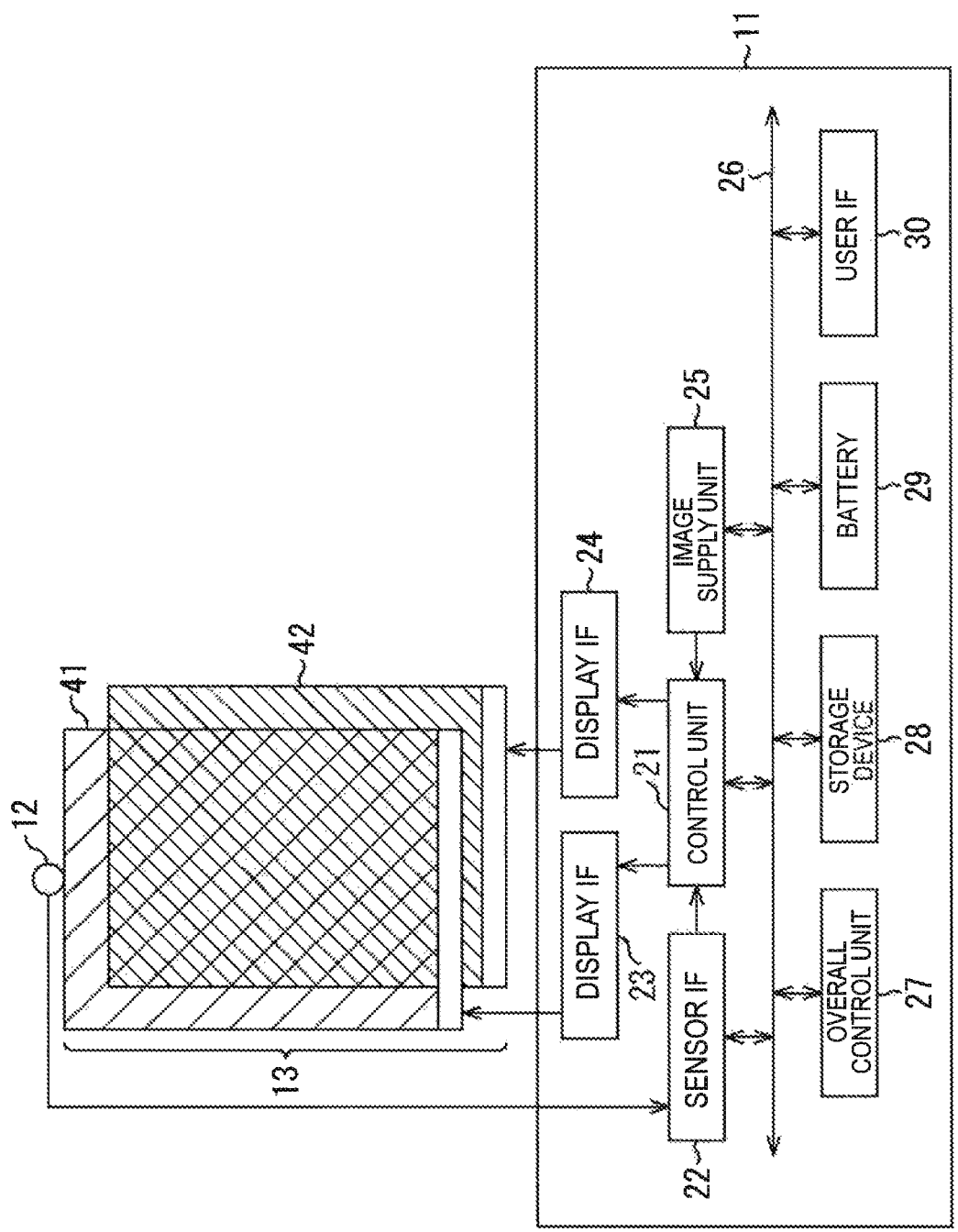
FIG. 1 is a block diagram illustrating a configuration example of a display control system to which the present technology is applied.

FIG. 1 is a block diagram illustrating a configuration example of a display control system to which the present technology is applied.

The display control system in FIG. 1 includes a display control apparatus 11, a sensor 12, and a display panel 13. In the display control system, the display panel 13 includes a plurality of display devices (a display device 41 and a display device 42).

The display control apparatus 11 distributes brightness information to the plurality of display devices in accordance with external light information from the sensor 12. On the basis of the distributed brightness information, the display control apparatus 11 drives each of the plurality of display devices and controls the displays of the plurality of display devices.

The display control apparatus 11 is configured so as to include a control unit 21, a sensor interface (IF) 22, a display IF 23, a display IF 24, an image supply unit 25, a bus 26, an overall control unit 27, a storage device 28, a battery 29, and an user IF 30.

The sensor IF 22, the control unit 21, the image supply unit 25, the overall control unit 27, the storage device 28, the battery 29, and the user IF 30 are interconnected through the bus 26.

The control unit 21 obtains a display output value of an input image from the image supply unit 25 in accordance with external light information from the sensor IF 22, and distributes the obtained display output value (display brightness information) to the plurality of display devices in accordance with the external light information. In performing the distribution, the control unit 21 may use, not only the external light information from the sensor IF 22, but also information such as remaining battery power information from the overall control unit 27, image feature information and motion information of the input image from the image supply unit 25.

The control unit 21 supplies the distributed display brightness information to each of the corresponding displays IF 23 and 24.

The sensor IF 22 supplies the external light information from the sensor 12 to the control unit 21.

The display IF 23 receives the display brightness information for the display device 41 from the control unit 21 as display drive information and drives the display device 41.

The display IF 24 receives the display brightness information for the display device 42 from the control unit 21 as display drive information and drives the display device 42.

The image supply unit 25 supplies image data, the image feature information, and the motion information of the input image displayed on the display panel 13 to the control unit 21.

The overall control unit 27 controls the overall display control apparatus 11 and, similar to a central processing unit (CPU), performs control of the various IFs with a software program. Furthermore, the overall control unit 27 acquires the remaining battery power information from the battery 29 and supplies the acquired remaining battery power information to the control unit 21.

The storage device 28 is a storage device with a relatively large capacity, such as a memory card or a hard disk drive. The battery 29 is included when the display control system is a mobile system and is configured so as to be rechargeable and capable of acquiring the remaining battery power information. The user IF 30 includes a touch panel, a keyboard, and a mouse, for example. Note that the storage device 28 and the user IF 30 are not necessarily required. Furthermore, when electric power is supplied from a power source, the battery 29 is also not necessarily required.

The sensor 12 is a device for acquiring light quantity of the external light and is a photosensor including a photodiode receiver, for example. In the example in FIG. 1, the sensor 12 is disposed in the middle of a portion above the display panel 13. The external light information from the light sensor 12 is supplied to the sensor IF 22 of the display control apparatus 11.

As described above, the display panel 13 is configured by stacking the display device 41 and the display device 42. Note that the number of display devices constituting the display panel 13 is not limited to two and may be any plural number.

The display device 41 is a device that is disposed on a display surface (an upper surface) and, for example, is an organic light-emitting diode (an OLED, organic electroluminescence (EL)) device with transparency. The OLED device is a self-luminous display device, emits light when a voltage is applied, and displays white or each of the RGB colors. When no voltage is applied thereto, the OLED device does not emit light, and since the OLED device is made of a material with high transparency, in the display panel 13, while the OLED device is in a highly transparent state, the display device 42 disposed on the backside is displayed.

Note that the display device 41 is not limited to an OLED and may be any transmission display and, furthermore, it is further preferable that the display device 41 be a self-luminous display.

The display device 42 is a device that is disposed on the backside (lower surface) and is a reflective electronic paper (E-Paper) device. The system of the electronic paper device does not matter and may be a microcapsule system, an electronic powder system, an electrowetting system, or the like. However, the OLED device is to be a device that changes to black or white when voltage is applied thereto and that can maintain the displayed state even when no voltage is applied thereto. Note that the display device 42 is not limited to E-Paper and may be any reflective display and, furthermore, it is further preferable that the display device 42 be capable of retaining the pixel state. Furthermore, the display colors are not necessarily only white and black. By using a color filter, it is possible to display in colors.

[Comparison Between E-Paper and OLED]

FIG. 2 is a diagram illustrating a general characteristic comparison between an E-Paper and an OLED.

Generally, the OLED that is an example of the display device 41 indicates high performance in brightness and gradation, color development, and response speed. Meanwhile, the E-Paper that is an example of the display device 42 is superior in power consumption and visibility under external light. Furthermore, the OLED has a risk of aging deterioration due to burn-in.

[Path of Display Light in Display Panel]

Figure 3:
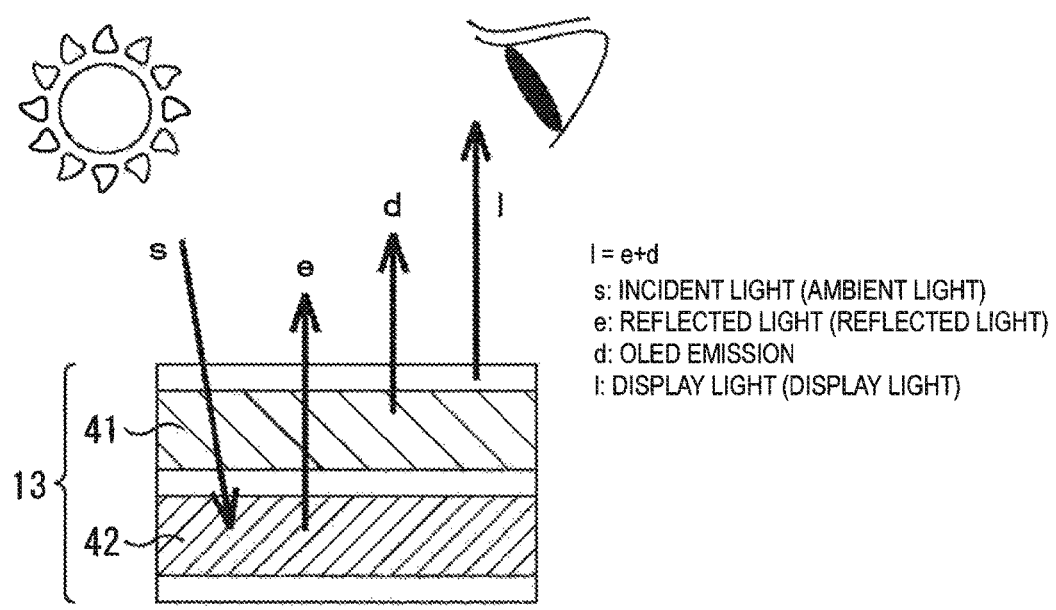
FIG. 3 is a diagram illustrating a path of a display light in a display panel.

FIG. 3 is a diagram illustrating a path of display light in the display panel.

The display panel 13 is configured by stacking the display device (the OLED, for example) 41 on the display device (the E-Paper, for example) 42.

Incident light (ambient light) of incident light information s is incident on the display panel 13. Correspondingly, display light (display light) of a display output value (display brightness) 1 is emitted from the display panel 13.

The display brightness 1 is the sum of the reflected light (reflected light) of an ePaper display brightness e from the display device 42 and an OLED emission of an OLED display brightness d from the display device 41.

[Configuration Example of Control Unit]

Figure 4:
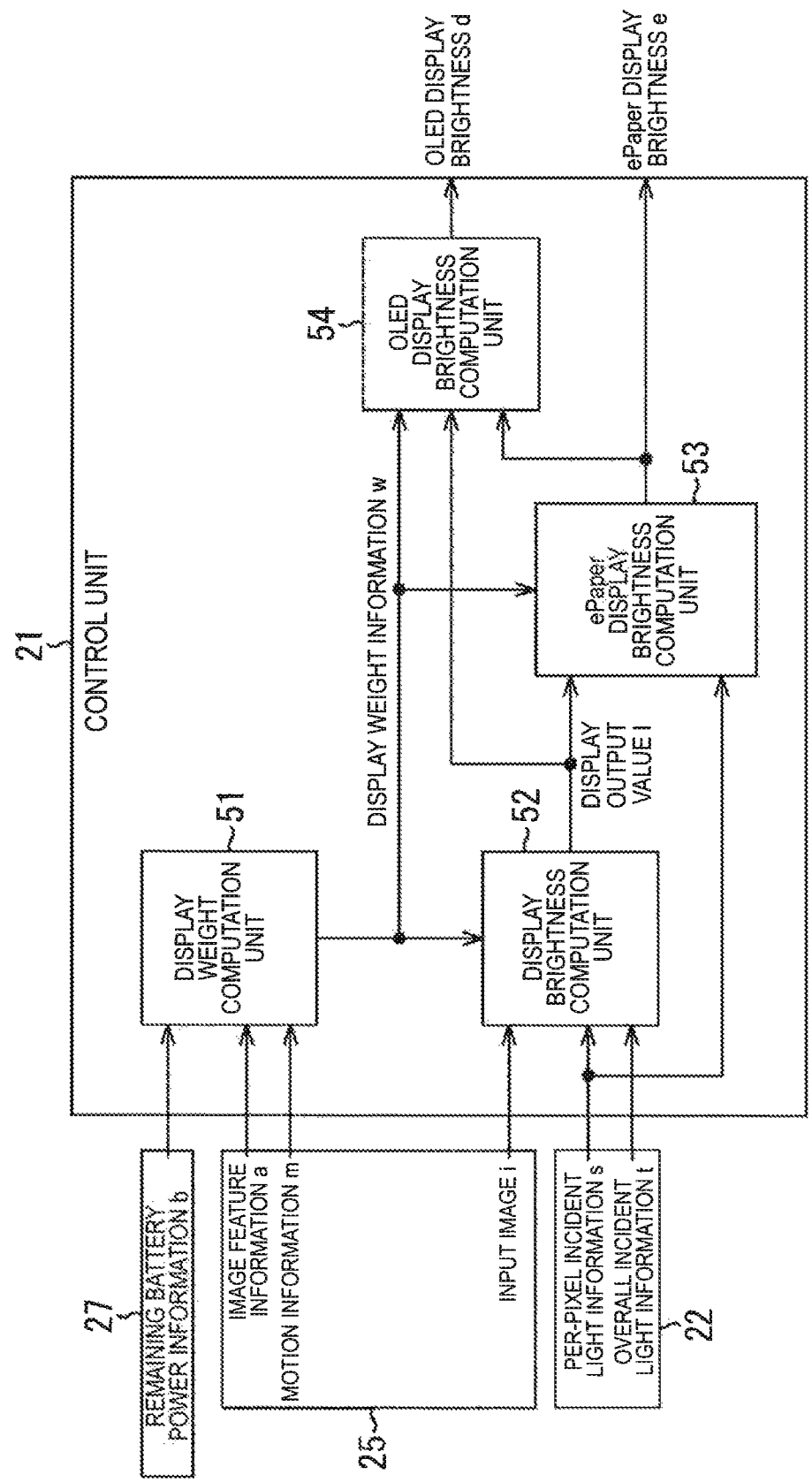
FIG. 4 is a block diagram illustrating a configuration example of a control unit.

FIG. 4 is a block diagram illustrating a configuration example of the control unit 21.

Remaining battery power information b is supplied to the control unit 21 from the overall control unit 27. Image data i, image feature information a, and motion information m of an image (an input image) displayed on the display panel 13 are supplied to the control unit 21 from the image supply unit 25.

Figure 5:
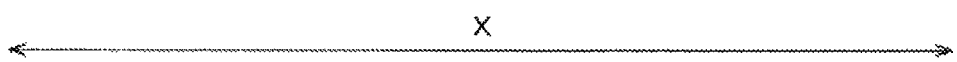
FIG. 5 is a diagram illustrating an example of a pixel arrangement of the display panel.

The image data i of the input image is a bitmap image such as a photograph, a moving image, or a text, and, as illustrated in a pixel arrangement in FIG. 5, assuming that i is a value of each pixel of the image data, $i=I(x, y)$ holds true, where x and y are indexes of a two-dimensional coordinate system. In the example in FIG. 5, the number of horizontal pixels is X and the number of vertical pixels is Y. Note that while i is indicated as a brightness value, in the case of a color image, i is expressed as a vector value such as (R, G, B).

The image feature information a is feature information of the image at coordinates (x, y) that indicates whether the focused pixel position is a text area or a natural image area, such as a photograph, and is expressed by $a=A(x, y)$. Assume that 0 indicates "a natural image" and 1 indicates "text", for example. The above information is, for example, generated in the image supply unit 25 as area information from information such as HTML in a case of a web browser screen; however, a method in which determination is made from the input image with a text area discrimination algorithm may be used, for example.

The motion information m indicates a motion amount per each pixel. In the motion information m, 0 indicates "no motion" and 1 indicates "there is motion", for example. Note that if desired to express motion sensitivity, an intermediate value between 0 and 1 may be obtained. Furthermore, while the unit of the information is a pixel, the unit of the information may be a certain area such as a block unit. When on a web browser screen or the like, information that is generated from HTML information as video reproduction area information may be used as the above motion information or determination on whether the motion information is of a video area or not may be made from inter-frame difference information.

Furthermore, the external light information from the sensor 12 that is converted into per-pixel incident light information s and overall incident light information t by the sensor IF 22 is supplied to the control unit 21.

Since the above sensor information is obtained per each pixel, per-pixel incident light information $s=S(x, y)$ holds true. The overall incident light information t is computed with a method such as averaging the per-pixel incident light information s. For example, the overall incident light information t is expressed by the following equation (1).

[Math. 1]

$$t=\Sigma S(x,y)/(X*Y) \quad (1)$$

Note that as the display control system illustrated in FIG. 1, when the display control system is configured by a single sensor 12, then, as $s=S(x, y)=t$, s will have the same value as t in all of the pixels.

Figure 6:
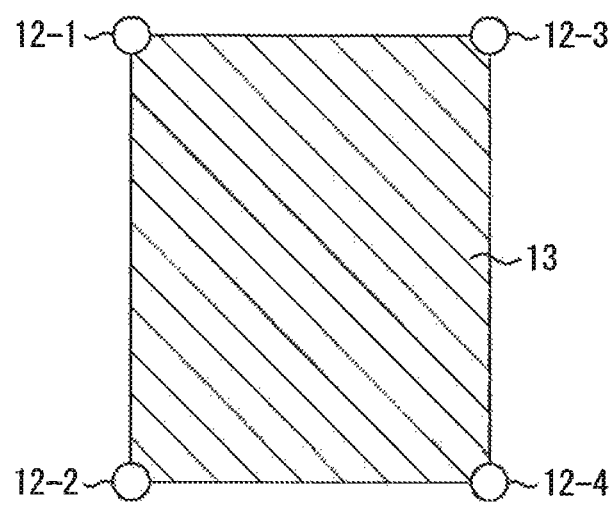
FIG. 6 is a diagram illustrating an example in which there are a plurality of sensors.

Furthermore, as illustrated in FIG. 6, a plurality of sensors 12-1 to 12-4 are disposed around the display panel 13 (in the four corners in the example of FIG. 6). Moreover, when each of the incident light of the sensors 12-1 to 12-4 are obtained as S1, S2, S3, and S4, then, as expressed in the following equation (2), the per-pixel incident light information s is computed through linear interpolation.

[Math. 2]

$$S=S(x,y)=(((S1*(X-x)+S3*x)/X)*(Y-y)+((S2*(X-x)+S4*x)/X)*y)/Y \quad (2)$$

Note that although computation through linear interpolation is performed herein, the computing method may be a different method such as spline interpolation. Furthermore, herein, although configured with four sensors 12-1 to 12-4, the number of sensors is not limited to any number as long as a measure for acquiring incident light information per each pixel is implemented. For example, if with a device having a sensor per each pixel, information thereof may be considered to be used.

Referring back to FIG. 4, the OLED display brightness d and the ePaper display brightness e are obtained in the control unit 21 from the above information, namely, the remaining battery power information b from the overall control unit 27, the image feature information a and the motion information m from the image supply unit 25, and the incident light information (s and t) from the sensor IF 22.

In the example in FIG. 4, the control unit 21 is configured so as to include a display weight computation unit 51, a display brightness computation unit 52, an ePaper display brightness computation unit 53, and an OLED display brightness computation unit 54.

The remaining battery power information b from the overall control unit 27, and the image feature information a and the motion information m from the image supply unit 25 are input to the display weight computation unit 51. On the basis of the input information, the display weight computation unit 51 computes display weight information w and supplies the computed display weight information w to the display brightness computation unit 52, the ePaper display brightness computation unit 53, and the OLED display brightness computation unit 54.

The input image (the image data) i from the image supply unit 25, the per-pixel incident light information s and the overall incident light information t from the sensor IF 22, and the display weight information w from the display weight computation unit 51 are input to the display brightness computation unit 52.

The display brightness computation unit 52 obtains a target maximum brightness R(w, t) from the overall incident light information t and the display weight information w. Then, the display brightness computation unit 52 performs computation on the image data i of the input image using the ratio obtained in the target maximum brightness R(w, t) so as to obtain a display output value l. The display brightness computation unit 52 supplies the obtained display output value l to the ePaper display brightness computation unit 53 and the OLED display brightness computation unit 54.

The per-pixel incident light information s from the sensor IF 22, the display weight information w from the display weight computation unit 51, and the display output value l from the display brightness computation unit 52 are input to the ePaper display brightness computation unit 53.

The ePaper display brightness computation unit 53 obtains ePaper display brightness e=E(x, y) from the per-pixel incident light information s and the display output value l. The ePaper display brightness computation unit 53 supplies the obtained ePaper display brightness e=E(x, y) to the OLED display brightness computation unit 54 and the display IF 24.

The display weight information w from the display weight computation unit 51, the display output value l from the display brightness computation unit 52, and ePaper display brightness e=E(x, y) from the ePaper display brightness computation unit 53 are supplied to the OLED display brightness computation unit 54.

The OLED display brightness computation unit 54 computes OLED display brightness d=D(x, y) from the display weight information w, the display output value l, and ePaper display brightness e=E(x, y). The OLED display brightness computation unit 54 supplies the computed OLED display brightness d=D(x, y) to the display IF 23.

[Details of Display Weight Computation]

In the present technology, switching between an OLED (display device 41) priority mode, an ePaper (display device 42) priority mode, and a normal mode are seamlessly performed in accordance with the remaining battery power and the image feature.

The conditions of the above are as in the following E1 to E3.

E1: the OLED (the display device 41) is prioritized when the remaining battery power is large, and the ePaper (the display device 42) display is prioritized when the remaining battery power is small.

E2: the OLED (the display device 41) is prioritized when the image feature is a natural image, and the ePaper (the display device 42) display is prioritized when the image feature is a text.

E3: the OLED (the display device 41) is prioritized when there is motion information.

Note that regarding E1 and E2, the above weight is added since the ePaper is more suited for low electric power and visibility of text. However, regarding E3, that is, the motion information, the ePaper is lower in response performance.

Note that assuming that when display weight information w=W(x, y) is 0.5, operation is normal (also referred to as the normal mode), when 0, the OLED is prioritized (also referred to the OLED priority mode), and when 1, the ePaper is prioritized (also referred to as the ePaper priority mode), then, computation can be performed as in the following expression (3).

[Math. 3]

If motion information $m=M(x,y)=1$: (there is motion), then $w=W(x,y)=0$ (priority on OLED).

If motion information $m=M(x,y)=0$: (static), then $w=W(x,y)=B+A(x,y)$.

Note that when w exceeds 1.0, the tipper value is limited to 1.0. (3)

Note that B is weight information computed from the remaining battery power information b, and at 0.5, operation is normal, and at 1.0, the ePaper is prioritized. As described above, a=A(x, y) is image feature information. The ePaper priority specification curve for obtaining the weight information B is as illustrated in FIG. 7.

Figure 7:
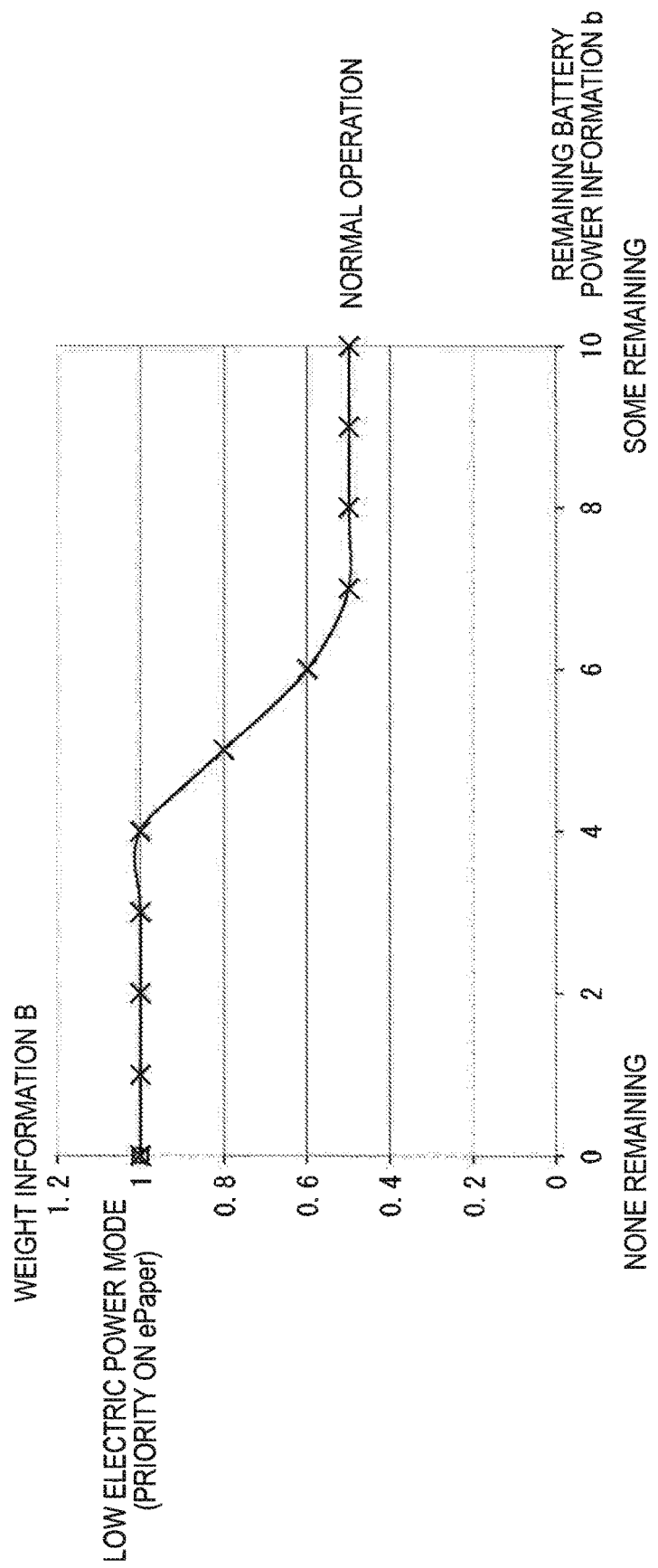
FIG. 7 is a diagram illustrating an example of an ePaper priority specification curve.

In the example in FIG. 7, an ePaper priority specification curve is illustrated. The axis of abscissas is the remaining battery power information b and the axis of ordinates is the weight information B computed from the remaining battery power information b, and w is normalized from 0 to 1. When weight information B=1, in a low electric power (ePaper priority) mode and when B=0.5, in a normal mode.

Note that the information is not information determined on the basis of each pixel but is information determined on the basis of the overall screen.

[Computation Table of Display Weight Information]

The display weight information w computed in the above manner is determined as illustrated in FIG. 8 below. FIG. 8 is a diagram illustrating a computation table of the display weight information w.

In a case in which weight information B from the remaining battery power information b=0.5 (some remaining), image feature information a=0 (natural image), and motion information m=0 (no motion), determination is made that display weight information w=0.5 (normal). In a case in which weight information B from the remaining battery power information b=0.5 (some remaining), image feature information a=0 (natural image), and motion information m=1 (there is motion), determination is made that display weight information w=0 (priority on OLED).

In a case in which weight information B from the remaining battery power information b=0.5 (some remaining), image feature information a=1 (text), and motion information m=0 (no motion), determination is made that display weight information w=1.0 (priority on ePaper). In a case in which weight information B from the remaining battery power information b=0.5 (some remaining), image feature information a=1 (text), and motion information m=1 (there is motion), determination is made that display weight information w=0 (priority on OLED).

In a case in which weight information B from the remaining battery power information b=1.0 (none remaining), image feature information a=0 (natural image), and motion information m=0 (no motion), determination is made that display weight information w=1.0 (priority on ePaper). In a case in which weight information B from the remaining battery power information b=1.0 (none remaining), image feature information a=0 (natural image), and motion information m=1 (there is motion), determination is made that display weight information w=0 (priority on OLED).

In a case in which remaining battery power information b=1.0 (none remaining), the image feature information a=1 (text), and motion information m=0 (no motion), determination is made that display weight information w=1.0 (priority on ePaper). In a case in which remaining battery power information b=1.0 (none remaining), the image feature information a=1 (text), and motion information m=1 (there is motion), determination is made that display weight information w=0 (priority on OLED).

Note that in the example in FIG. 8, an example in which w has only three values, namely, 0, 0.5, and 1.0 is illustrated; however, in actuality, w is a stepwise value set in accordance with the input information.

[Details of Display Brightness Computation]

The display brightness computation unit 52 computes the display output value l from the overall incident light information t and the display weight information w. The display output value l is computed in the order of P1 and P2 below.

Figure 9:
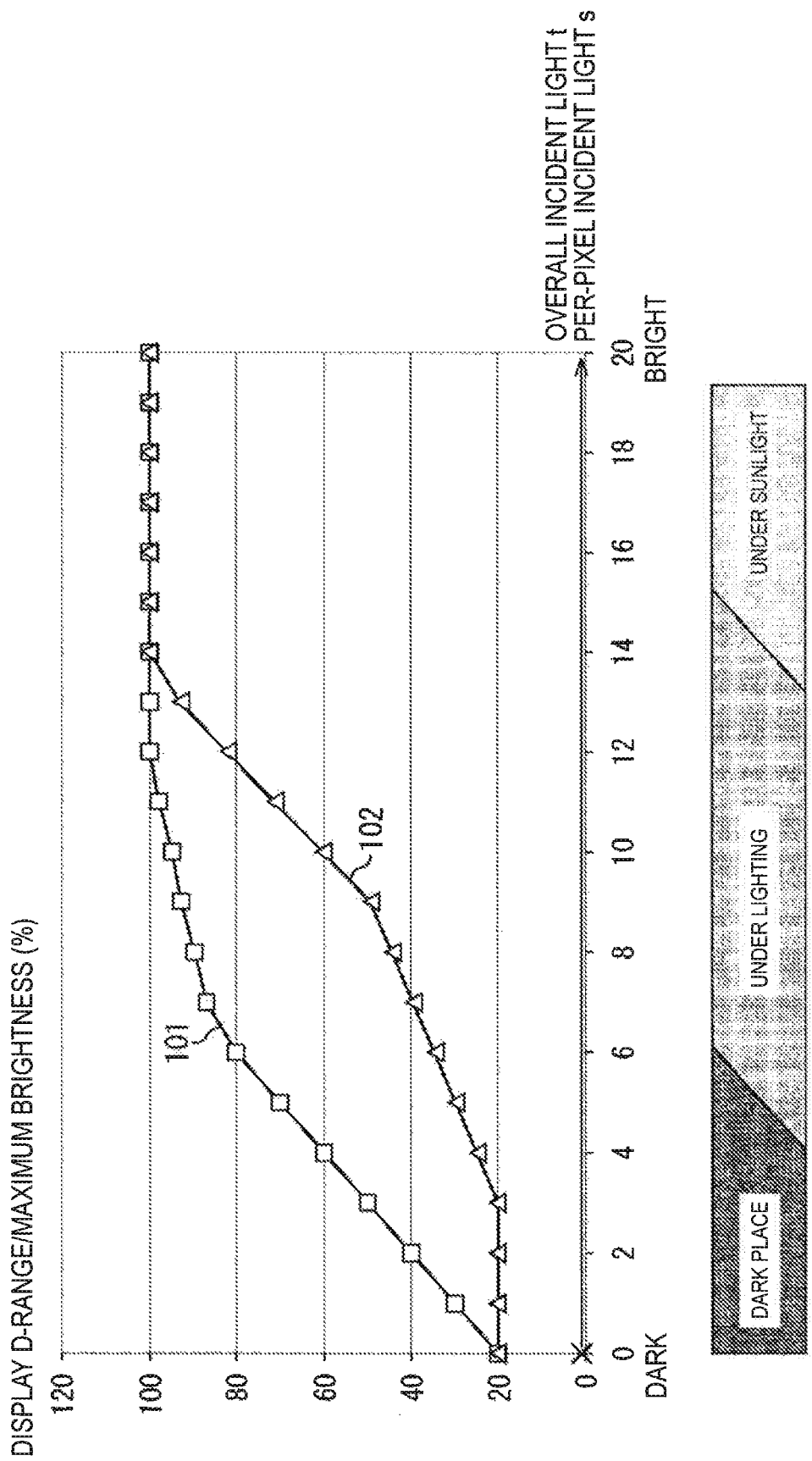
FIG. 9 is a diagram illustrating examples of display brightness computation curves.

As P1, the display brightness computation unit 52 determines the target maximum brightness R(w, t). In the example in FIG. 9, a display brightness computation curve for determining the target maximum brightness R(w, t) is illustrated. The axes of abscissas indicate the overall incident light information t and the per-pixel incident light information s, and the axis of ordinates illustrates the display D-Range/maximum brightness (%).

The display brightness computation curve 101 illustrates target maximum brightness R(0.5, t) and R(0, t) when the display weight information is normal (w=0.5) and when the display weight information prioritizes the OLED (w=0). The display brightness computation curve 102 illustrates target maximum brightness R(1.0, t) when the display weight information prioritizes the ePaper (w=1).

When the display weight information is normal (w=0.5) and prioritizes the OLED (w=0), in a state in which overall incident light information t is low=a dark state, viewing can be performed even when the overall light emitting amount is small. Accordingly, in such a case, when the target maximum brightness R(w, t) is suppressed while the overall incident light information t increases, the overall contrast needs to be increased; therefore, the display brightness computation curve 101 that increases the target maximum brightness R(w, t) is selected.

On the other hand, when the display weight information prioritizes the ePaper (w=1.0), the display brightness computation curve 102 is selected. In the display brightness computation curve 102, while in a dark state, the OLED is made to emit light with a certain brightness, and while in a certain brightness or brighter, most of the brightness component is allocated to the ePaper; accordingly, a table value (a target maximum brightness) is one that is in accordance with the ePaper display brightness computation curve in FIG. 10 described later.

Note that the value of the target maximum brightness R(w, t) is determined by determining a display brightness computation curve with the overall incident light information t when the weight is w=0, w=0.5, or w=1, and by linear interpolation when the value of w is an intermediate value.

In the above manner, the target maximum brightness R(w, t) is determined according to the display weight information w and the overall incident light information t.

As P2, the display brightness computation unit 52 performs computation on the image signal (the image data) i of the input image using the ratio obtained in the target maximum brightness R(w, t) so as to compute a display output value l. Herein, if the target maximum brightness R(t) is a 100 minutes notation, the following equation holds true.

[Math. 4]

$$l=i*R(w,t)/100 \qquad (4).$$

Herein, since l and i are values determined per pixel, another expression will be the following equation (5).

[Math. 5]

$$l(x,y)=I(x,y)*R(w,t)/100 \qquad (5)$$

[Details of ePaper Display Brightness Computation]

The ePaper display brightness computation unit 53 obtains ePaper display brightness e=E(x, y) from per-pixel incident light information s=S(x, y) and display output value l=L(x, y). Since an output value e of the ePaper display brightness is physically determined in accordance with the incident light information, the output value e is obtained with an ePaper display brightness computation curve illustrated in FIG. 10.

Figure 10:
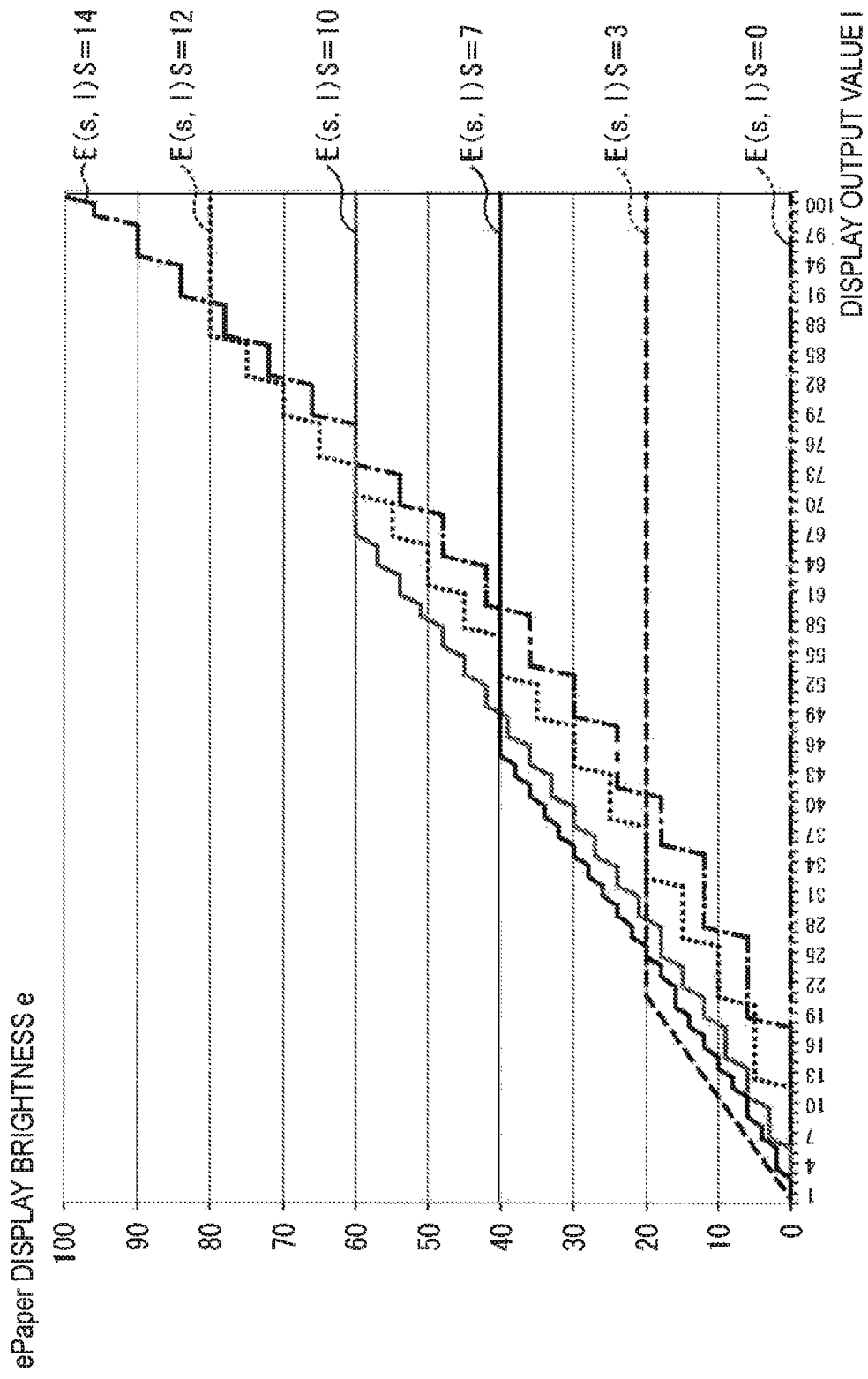
FIG. 10 is a diagram illustrating examples of ePaper display brightness computation curves.

In the example in FIG. 10, ePaper display brightness computation curves each corresponding to the corresponding sizes (S=0, 3, 7, 10, 12, and 14) of the per-pixel incident light information s=S(x, y) is illustrated. The axis of abscissas is the display output value l and the axis of ordinates is the ePaper display brightness e.

The display paper has a gradation of 16 gradations and the ePaper display brightness computation curves have characteristics in which the maximum brightness that can be displayed is changed by the incident light, in other words, when the incident light information s is small, the brightness value that can be expressed is low and when the incident light information s is large, the brightness value that can be expressed is high. Note that, herein, the gradation of the electronic paper is 16 gradations; however, the number of gradations differs depending on the characteristics of the used device such that there is a case in which there are more gradations and a case in which there are less gradations.

Note that the curves may be obtained by referring to a table or may be obtained through a calculation formula; however, the output characteristics of the device are to be obtained beforehand by measuring thereof with an illuminometer or a brightness photometer.

[Details of OLED Display Brightness Computation]

As in the following expression (6), the OLED display brightness computation unit 54 computes OLED display brightness d=D(x, y) from display weight information w=W(x, y), display output value l=L(x, y), and ePaper display brightness e=E(x, y).

[Math. 6]

$$0.0<=w<=0.5 \, d=l*(1-2*w)+(l-e)*(2*w)$$

$$0.5<w<=1.0 \, d=(l-e)*(2-2*w) \qquad (6)$$

In other words, the OLED display brightness computation unit 54 assumes that, when display weight information w=0.0 and when the OLED is prioritized, l is as it is, OLED display brightness d. When display weight information w=0.5 and when in normal mode, the difference l−e is assumed as OLED display brightness d. Furthermore, when display weight information w=0.5, the OLED display brightness computation unit 54 assumes that it is a normal mode and when display weight information w=1.0, prioritizes the ePaper and assumes that OLED display brightness d=0.

In the above manner, the OLED display brightness for the display device 41 and the ePaper display brightness for the display device 42 are obtained in the control unit 21.

[Relationship Between Incident Light and Maximum Brightness of Each Device]

Figure 11:
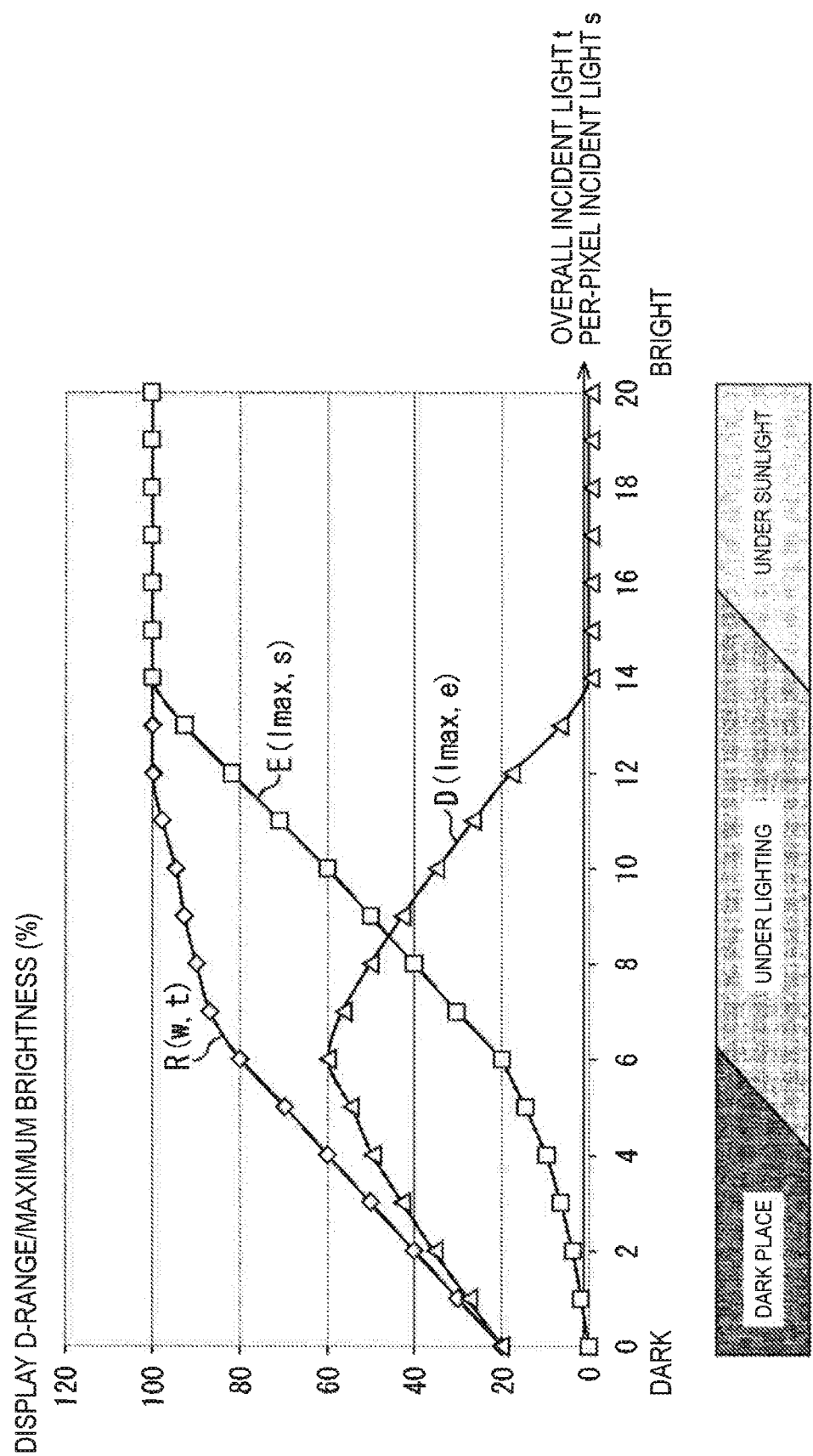
FIG. 11 is a diagram illustrating a relationship between incident light during normal mode (w=0.5) and maximum brightness.
Figure 12:
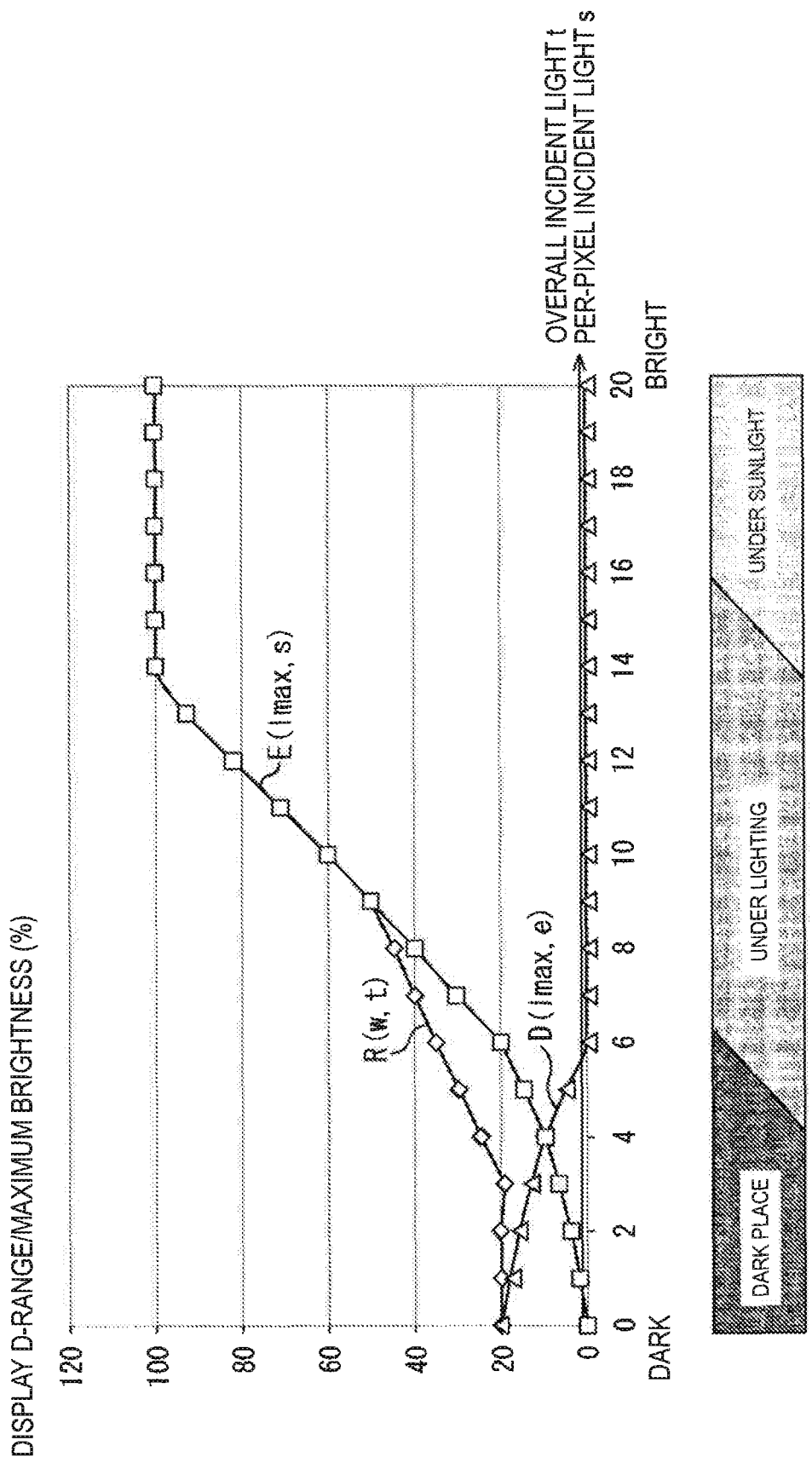
FIG. 12 is a diagram illustrating a relationship between incident light during ePaper priority mode (w=1.0) and maximum brightness.
Figure 13:
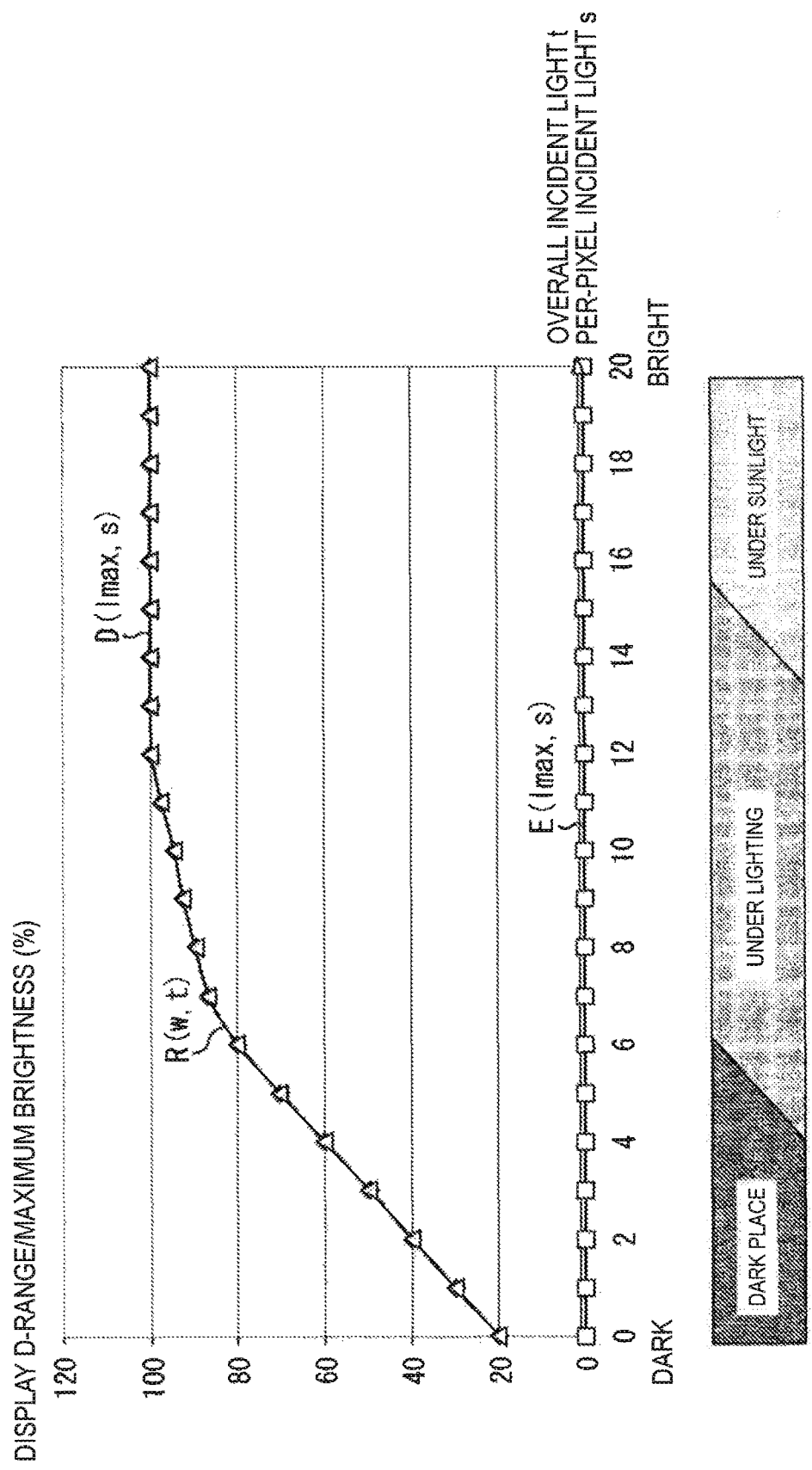
FIG. 13 is a diagram illustrating a relationship between incident light during OLED priority mode (w=0.0) and maximum brightness.

Referring next to FIGS. 11 to 13, relationships between the incident light and the brightness that is distributed to each display device will be described. In the example in FIG. 11, a relationship between the incident light during normal mode (display weight information w=0.5) and the maximum brightness is illustrated. In the example in FIG. 12, a relationship between the incident light when the ePaper is prioritized (display weight information w=1.0) and the maximum brightness is illustrated. In the example in FIG. 13, a relationship between the incident light when the OLED is prioritized (display weight information w=0.0) and the maximum brightness is illustrated.

In each of the diagrams, R(w, t) indicates the target maximum brightness. E(lmax, s) indicates the maximum brightness of the display device (ePaper) 42 that is determined from the display output value l and the external light information (incident light information) s. D(lmax, e) indicates the maximum brightness of the display device (OLED) 41 that is determined from the display output value l and the ePaper display brightness e. Furthermore, the axis of abscissas indicates the overall incident light information t and the per-pixel incident light information s, in which incident light of 0 to about 5 corresponds to a dark place, incident light of about 5 to about 15 corresponds to under lighting, and incident light of about 15 to 20 corresponds to under sun light. The axis of ordinates indicates the display D-Range/maximum brightness (%).

During normal mode (w=0.5), as illustrated in FIG. 11, the maximum light emitting amount of the OLED can be suppressed to about 60% even in the condition of under lighting. When ePaper is prioritized (w=1.0), as illustrated in FIG. 12, the display device (OLED) 41 is made to emit light only when in a dark place. When OLED is prioritized (w=0.0), as illustrated in FIG. 13, the allocation to the display device (ePaper) 42 side is 0 at all times.

With the above, when indoors, by preferentially displaying the OLED, display can be performed with high image quality and high quality. When outdoors, by preferentially displaying the electronic paper, the display can be one that can be viewed easily even under sunlight. In a case of a moving image, due to responsiveness, the electronic paper will have difficulty in displaying the moving image, however, the OLED can display the moving image in high quality. Text can be displayed while giving priority to the paper look, and power can be saved.

In other words, the present technology can improve visibility under various environments.

Furthermore, the present technology can perform the above-described switching in a seamless manner.

Furthermore, the present technology can save power by seamlessly switching the operation modes in accordance with the remaining battery power and by suppressing the light emitting amount of the OLED when displaying a photograph. Furthermore, by suppressing the light emitting amount of the OLED, progress in aging deterioration can be slowed down such that the life of the device can be increased.

[Operation of the Display Control System]

Figure 14:
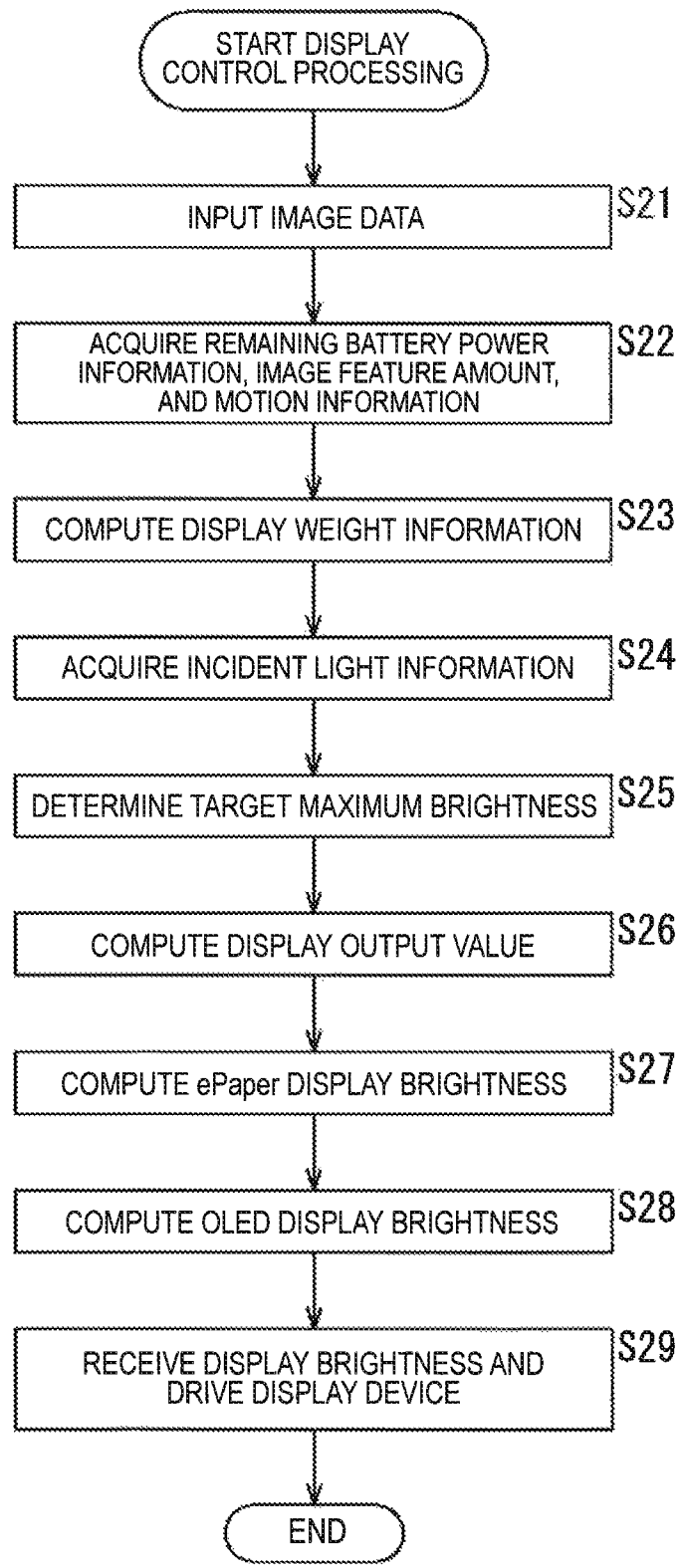
FIG. 14 is a flowchart describing display control processing.

Referring next to the flowchart in FIG. 14, display control processing of the display control system will be described.

The image supply unit 25 supplies the image data i of the input image to be displayed on the display panel 13 to the display brightness computation unit 52 of the control unit 21. In step S21, the display brightness computation unit 52 inputs the image data i of the input image.

At that time, the image supply unit 25 supplies the image feature information a and the motion information m of the input image to the display weight computation unit 51 of the control unit 21. Furthermore, the overall control unit 27 acquires remaining battery power information b from the battery 29 and supplies the acquired remaining battery power information to the control 21.

In step S22, the display weight computation unit 51 acquires the remaining battery power information b, the image feature information a, and the motion information m, and in step S23, computes the display weight information w. The computed display weight information w is supplied to the display brightness computation unit 52, the ePaper display brightness computation unit 53, and the OLED display brightness computation unit 54.

Furthermore, the incident light information (the per-pixel incident light information s and the overall incident light information t) is supplied from the sensor IF 22. In step S24, the display brightness computation unit 52 acquires the incident light information.

In step S25, the display brightness computation unit 52 determines the target maximum brightness R(w, t) from the overall incident light information t acquired in step S24 and the display weight information w computed in step S23.

In step S26, the display brightness computation unit 52 performs computation on the image data i of the input image input in step S21 using the ratio obtained in the target maximum brightness R(w, t) determined in step S25 so as to obtain a display output value l. The obtained display output value l is supplied to the ePaper display brightness computation unit 53 and the OLED display brightness computation unit 54.

In step S27, the ePaper display brightness computation unit 53 obtains ePaper display brightness e=E(x, y) from the per-pixel incident light information s acquired in step S24 and the display output value l obtained in step S26. The obtained ePaper display brightness e=E(x, y) is supplied to the OLED display brightness computation unit 54 and the display IF 24.

In step S28, the OLED display brightness computation unit 54 computes OLED display brightness d=D(x, y) from the display weight information w computed in step S23, the display output value l determined in step S26, and ePaper display brightness e=E(x, y) obtained in step S27. The computed OLED display brightness d=D(x, y) is supplied to the display IF 23.

In step S29, the display IF 24 and the display IF 23 receives OLED display brightness d=D(x, y) and ePaper display brightness e=E(x, y), respectively, and drives the corresponding one of the display devices 41 and 42. With the above, the input image is displayed on the display panel 13.

As described above, in the display control system, brightness information is distributed to the plurality of display devices in accordance with the external light information (incident light information) from the sensor. Accordingly, the plurality of display device can be seamlessly switched.

[Computer Configuration Example]

The series of processes described above can be executed by hardware but can also be executed by software. When the series of processes is executed by software, a program that constructs such software is installed into a computer. Here, the expression "computer" includes a computer in which dedicated hardware is incorporated and a general-purpose personal computer or the like that is capable of executing various functions when various programs are installed.

Figure 15:
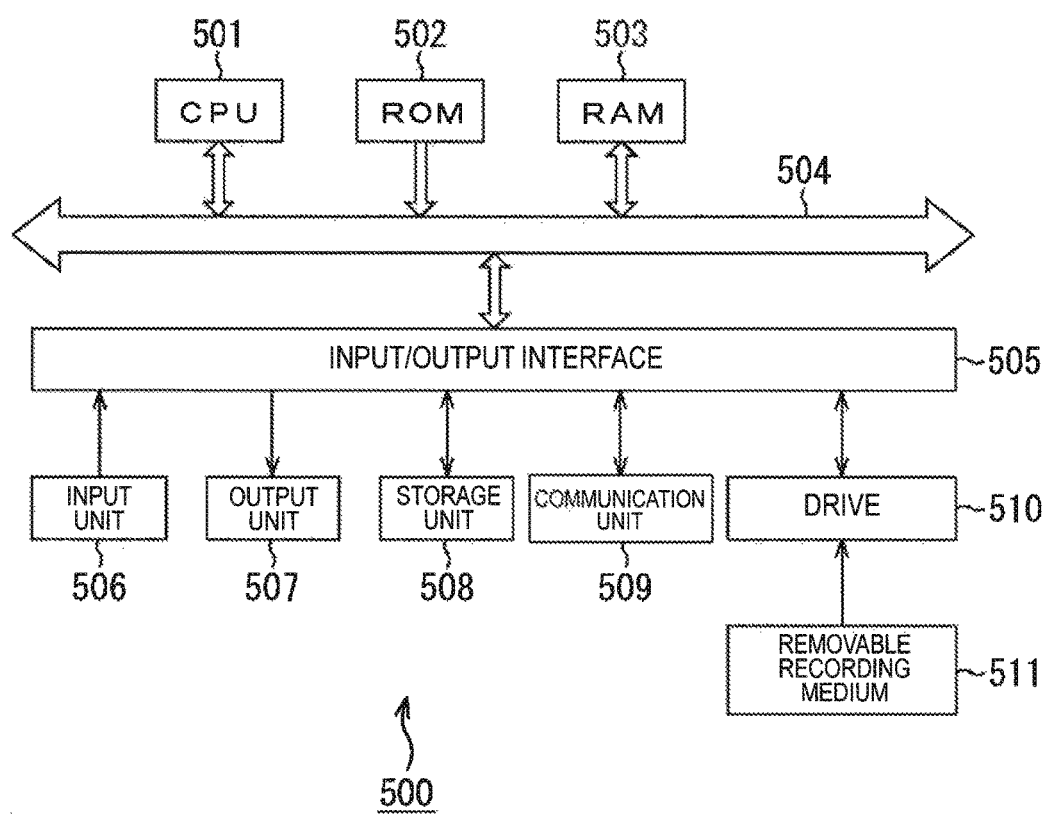
FIG. 15 is a block diagram illustrating a main configuration example of a computer.

FIG. 15 is a block diagram showing an example configuration of the hardware of a computer that executes the series of processes described earlier according to a program.

In a computer 500, a CPU (Central Processing Unit) 501, a ROM (Read Only Memory) 502, and a RAM (Random Access Memory) 503 are mutually connected by a bus 504.

An input/output interface 505 is also connected to the bus 504. An input unit 506, an output unit 507, a storage unit 508, a communication unit 509, and a drive 510 are connected to the input/output interface 505.

The input unit 506 is configured from a keyboard, a mouse, a microphone or the like. The output unit 507 configured from a display, a speaker or the like. The storage unit 508 is configured from a hard disk, a non-volatile memory or the like. The communication unit 509 is configured from a network interface or the like. The drive 510 drives a removable recording medium 511 such as a magnetic disk, an optical disk, a magneto-optical disk, a semiconductor memory or the like.

In the computer configured as described above, as one example the CPU 501 loads a program stored in the storage unit 508 via the input/output interface 505 and the bus 504 into the RAM 503 and executes the program to carry out the series of processes described earlier.

As one example, the program executed by the computer 500 (the CPU 501) may be provided by being recorded on the removable recording medium 511 as a packaged medium or the like. The program can also be provided via a wired or wireless transfer medium, such as a local area network, the Internet, or a digital satellite broadcast.

In the computer, by loading the removable recording medium 511 into the drive 510, the program can be installed into the storage unit 508 via the input/output interface 505. It is also possible to receive the program from a wired or wireless transfer medium using the communication unit 509 and install the program into the storage unit 508. As another alternative, the program can be installed in advance into the ROM 502 or the storage unit 508.

Note that the program executed by the computer may be a program in which processes are carried out in a time series in the order described in this specification or may be a program in which processes are carried out in parallel or at necessary timing, such as when the processes are called.

Note that, in this specification, steps that write the program to be recorded in the recording medium do not necessarily have to be performed in time series in line with the order of the steps, and instead may include processing that is performed in parallel or individually.

Further, in this specification, "system" refers to a whole device composed of a plurality of devices.

Further, an element described as a single device (or processing unit) above may be divided and configured as a plurality of devices (or processing units). On the contrary, elements described as a plurality of devices (or processing units) above may be configured collectively as a single device (or processing unit). Further, an element other than those described above may be added to each device (or processing unit). Furthermore, a part of an element of a given device (or processing unit) may be included in an element of another device (or another processing unit) as long as the configuration or operation of the system as a whole is substantially the same. In other words, an embodiment of the disclosure is not limited to the embodiments described above, and various changes and modifications may be made without departing from the scope of the disclosure.

An embodiment of the disclosure is not limited to the embodiments described above, and various changes and modifications may be made without departing from the scope of the disclosure.

For example, the display device 41 and the display device 42 in FIG. 1 may be provided inside the display control apparatus 11, furthermore, for example, the display IFs 23 and 24 may be provided outside the display control apparatus 11.

For example, the present disclosure can adopt a configuration of cloud computing which processes by allocating and connecting one function by a plurality of apparatuses through a network.

Further, each step described by the above-mentioned flow charts can be executed by one apparatus or by allocating a plurality of apparatuses.

In addition, in the case where a plurality of processes are included in one step, the plurality of processes included in this one step can be executed by one apparatus or by sharing a plurality of apparatuses.

The preferred embodiments of the present invention have been described above with reference to the accompanying drawings, whilst the present invention is not limited to the above examples, of course. A person skilled in the art may find various alterations and modifications within the scope of the appended claims, and it should be understood that they will naturally come under the technical scope of the present invention.

Additionally, the present technology may also be configured as below.

(1)

A display control apparatus including:

a display control unit configured to distribute brightness information to a plurality of display devices in accordance with external light amount information from a sensor; and a plurality of drive units configured to drive the plurality of display devices on a basis of the brightness information distributed by the display control unit.

(2)

The display control apparatus according to (1), further including:

the sensor configured to acquire the external light amount information.

(3)

The display control apparatus according to (1) or (2), wherein among the plurality of display devices, a display device stacked on an upper surface is a transmission display device and a display device stacked on a lower surface is a reflective display device.

(4)

The display control apparatus according to any of (1) to (3), wherein the display device stacked on the upper surface is a self-luminous display device and the display device stacked on the lower surface is a display device that retains a pixel state.

(5)
The display control apparatus according to any of (1) to (4),
wherein the display device stacked on the upper surface is an organic light-emitting diode (OLED) and the display device stacked on the lower surface is an electronic paper display device.

(6)
The display control apparatus according to any of (1) to (5), further including:
a weight computation unit configured to compute a display weight, on a basis of whether an area is a text or a graphic area, as image feature information of an input image,
wherein the display control unit distributes the brightness information to the plurality of display devices in accordance with the display weight computed by the weight computation unit.

(7)
The display control apparatus according to any of (1) to (5), further including:
a weight computation unit configured to compute a display weight on a basis of motion information of an input image,
wherein the display control unit distributes the brightness information to the plurality of display devices in accordance with the display weight computed by the weight computation unit.

(8)
The display control apparatus according to any of (1) to (5), further including:
a weight computation unit configured to compute a display weight on a basis of remaining battery power information,
wherein the display control unit distributes the brightness information to the plurality of display devices in accordance with the display weight computed by the weight computation unit.

(9)
A display control method including:
distributing, by a display control apparatus, brightness information to a plurality of display devices in accordance with external light amount information from a sensor; and
driving, by the display control apparatus, each of the plurality of display devices on a basis of the distributed brightness information.

REFERENCE SIGNS LIST 11 display control apparatus
12, 12-1 to 12-4 sensor
13 display panel
21 control unit
22 sensor IF
23, 24 display IF
25 image supply unit
26 bus
27 overall control unit
28 storage device
29 battery
30 user IF
41, 42 display device
51 display weight computation unit
52 display brightness computation unit
53 ePaper display brightness computation unit
54 OLED display brightness computation unit

The invention claimed is:

1. A display control apparatus comprising:
a display control unit configured to distribute display brightness information to a plurality of stacked display devices in accordance with external light amount information acquired from a sensor;
a plurality of drive units configured to drive the plurality of stacked display devices on a basis of the display brightness information distributed by the display control unit; and
a weight computation unit configured to compute a display weight as a stepwise value of priority between the plurality of stacked display devices, on a basis of the external light amount information,
wherein the display control unit is further configured to distribute the display brightness information to the plurality of stacked display devices in accordance with the display weight computed by the weight computation unit, and
wherein the display control unit, the plurality of drive units, and the weight computation unit are each implemented via at least one processor.

2. The display control apparatus according to claim 1, further comprising the sensor configured to acquire the external light amount information.

3. The display control apparatus according to claim 1,
wherein the plurality of stacked display devices comprises:
an upper display device stacked on an upper surface and configured as a transmission display device; and
a lower display device stacked on a lower surface and configured as a reflective display device.

4. The display control apparatus according to claim 3,
wherein the upper display device stacked on the upper surface is a self-luminous display device and the lower display device stacked on the lower surface is a display device that retains a pixel state.

5. The display control apparatus according to claim 4,
wherein the upper display device stacked on the upper surface is an organic light-emitting diode (OLED) and the lower display device stacked on the lower surface is an electronic paper display device.

6. The display control apparatus according to claim 3, wherein the plurality of drive units are further configured to selectively drive one or more of the upper display device and the lower display device on the basis of the display brightness information.

7. The display control apparatus according to claim 6,
wherein the weight computation unit is further configured to compute the display weight as image feature information of an input image, and
wherein the display control unit is further configured to selectively distribute the display brightness information to one or more of the upper display device and the lower display device in accordance with the display weight computed by the weight computation unit.

8. The display control apparatus according to claim 1,
wherein the weight computation unit is further configured to compute the display weight on a basis of whether an area is a text or a graphic area, as image feature information of an input image.

9. The display control apparatus according to claim 1,
wherein the weight computation unit is further configured to compute the display weight on a basis of motion information of an input image.

10. The display control apparatus according to claim 1, wherein the weight computation unit is further configured to compute the display weight on a basis of remaining battery power information.

11. A display control method, implemented via at least one processor, the method comprising:
- computing, by a display control apparatus, a display weight as a stepwise value of priority between a plurality of stacked display devices in accordance with external light amount information acquired from a sensor;
- distributing, by the display control apparatus, display brightness information to the plurality of stacked display devices in accordance with the computed display weight; and
- driving, by the display control apparatus, each display device of the plurality of stacked display devices on a basis of the distributed brightness information.

12. A non-transitory computer-readable medium having embodied thereon a program, which when executed by a computer, causes the computer to execute a method, the method comprising:
- computing, by a display control apparatus, a display weight as a stepwise value of priority between a plurality of stacked display devices in accordance with external light amount information acquired from a sensor;
- distributing, by the display control apparatus, display brightness information to the plurality of stacked display devices in accordance with the computed display weight; and
- driving, by the display control apparatus, each display device of the plurality of stacked display devices on a basis of the distributed brightness information.

* * * * *